United States Patent [19]
Bantu et al.

[11] Patent Number: 5,268,260
[45] Date of Patent: Dec. 7, 1993

[54] PHOTORESIST DEVELOP AND STRIP SOLVENT COMPOSITIONS AND METHOD FOR THEIR USE

[75] Inventors: Nageshwer R. Bantu, Endicott; Anilkumar C. Bhatt, Johnson City; Ashwinkumar C. Bhatt, Endicott; Joseph A. Kotylo, Binghamton; Gerald W. Jones, Johnson City; Robert J. Owen, Binghamton; Kostas Papathomas; Anaya K. Vardya, both of Endicott, all of N.Y.

[73] Assignee: International Business Machines Corporation, Armonk, N.Y.

[21] Appl. No.: 781,542

[22] Filed: Oct. 22, 1991

[51] Int. Cl.$^5$ .......................... G03F 7/30; G03F 7/32
[52] U.S. Cl. ..................................... 430/325; 430/331
[58] Field of Search ............... 430/309, 311, 315, 325, 430/331

[56] References Cited

U.S. PATENT DOCUMENTS

| | | | |
|---|---|---|---|
| 4,326,010 | 4/1982 | Bauer | 428/423 |
| 4,497,889 | 2/1985 | Fuerniss | 430/260 |
| 4,544,623 | 10/1985 | Alldykowski et al. | 430/330 |
| 4,547,455 | 10/1985 | Hiramoto et al. | 430/325 |
| 4,693,959 | 9/1987 | Ashcraft | 430/323 |
| 4,828,948 | 5/1989 | Ahne et al. | 430/325 |
| 4,863,835 | 9/1989 | Shimizu et al. | 430/331 |
| 4,940,651 | 7/1990 | Brown et al. | 430/325 |
| 5,007,969 | 4/1991 | Doscher | 430/331 |
| 5,026,624 | 6/1991 | Day et al. | 430/311 |
| 5,194,365 | 3/1993 | Goodin et al. | 430/325 |

FOREIGN PATENT DOCUMENTS 63-168651  7/1988  Japan .................. 430/221

Primary Examiner—Marion E. McCamish
Assistant Examiner—Janis L. Dote
Attorney, Agent, or Firm—Judith Olsen; Richard M. Goldman

[57] ABSTRACT

Simple, environmentally friendly developers and strippers are disclosed for free radical-initiated, addition polymerizable resists, cationically cured resists and solder masks and Vacrel photoresists. In all cases both the developers and the strippers include gamma butyrolactone, propylene carbonate and benzyl alcohol, optionally also including a minor amount of methanol, ethanol, isopropyl alcohol, propylene glycol monomethylacetate, ethylene glycol monomethyl ether, formamide, nitromethane, propylene oxide, or methyl ethyl ketone, acetone and water.

3 Claims, No Drawings

PHOTORESIST DEVELOP AND STRIP SOLVENT COMPOSITIONS AND METHOD FOR THEIR USE

FIELD OF THE INVENTION

The present invention relates to the field of lithography wherein a radiation-sensitive material called a photoresist is disposed on a substrate, exposed in preselected areas to the radiation to which it is sensitive, and developed in a solvent or in a mixture of solvents. In the case of positive photoresist, the solvents selectively dissolve the regions of the photoresist which have been exposed to the radiation; in the case of negative photoresist, the regions left unexposed. Photolithographic processes have proven particularly useful in creating microminiature or fine line circuitry patterns in the art of electronic packaging and have also been useful in the art of photolithographic printing, metal decorating and photomilling.

BACKGROUND OF THE INVENTION

Photolithography plays a critical role in the art of printed circuit packaging. Negative acting photoresists include an organic resin binder, a photoinitiator/photosensitizer and a reactive monomer. Optionally, they include also organic or inorganic fillers, fire retardants, plasticizers, dyes, flexibilizers, thermal stabilizers and other additives to improve the processing characteristics of the package. Typically the composition will comprise 40 to 70% by weight of binder, 10 to 40% by weight of monomer, and 0.5 to 15% by weight of photoinitiator to total 100% based on the weight of all these components. An example of such compositions is described in U.S. Pat. No. 4,326,010. (example 1). Depending on their composition, known photoresists are sensitive to UV radiation, X-rays, E-beams and so forth. The radiation may be furnished to the resist through a pattern in a mask, such as an emulsion mask or chrome mask, by contact or projection, or a beam of radiation may be rastered. There are basically two types of photoresist: negative and positive. When a negative photoresist is selectively exposed to the particular radiation to which it is sensitive for an adequate period of time and then subjected to its developer, the areas of the resist which have not been exposed to radiation are removed by the developer, whereas the areas which have been exposed to radiation are hardened thereby by cross-linking and made more resistant to developer, relative to the unexposed regions. On the other hand the positive acting resists behave oppositely; the exposed regions are removed preferentially.

Positive photoresists are used extensively to fabricate silicon deivces. They, however, perform poorly in high caustic environments and high temperatures.

The negative resists, on the other hand, are used when the circuit lines are provided by additive plating of copper, in areas where copper is desired, i.e., electroless or electroless plus electroplating, rather than by etching of copper away from where it is not desired.

Photolithographic processes in packaging are described in *Microelectronics Packaging Handbook*, Pub. Van Nostrand Reinhold, New York, 1989, Tummala et al, eds. on pages 898–903, and in *Principles of Electronic Packaging*, Pub. McGraw-Hill Book Company, New York, 1989, Seraphim et al, eds. in Chapter 12, pages 372–393 and in *Scientific Encyclopedia*, 6th Ed., Vol. II, Pub. Van Nostrand Reinhold Company, New York, 1983, Considine et al, eds., pages 1877–1881, all of which are incorporated herein by reference for use as background.

In general negative-working resists are photopolymerizable materials of the type described in U.S. Pat. No. 3,469,982, U.S. Pat. No. 4,273,857 and U.S. Pat. No. 4,293,635 and the photocrosslinkable species of the type disclosed in U.S. Pat. No. 3,526,504.

Included in the following are monomers which can be used either alone or in combination with others such as those in the conventional photoresists: t-butyl acrylate, 1,5 pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol dicarylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di-(p-hydroxyphenyl)-propane diacrylate, pentaerythritol tetraacrylate, 2,2-di(p-hydrohyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene,1,4-benzenediol dimethacrylate, 1,4-diisopropenyl benzene, and 1,3,5-triisopropenyl benzene.

In addition to the monomers mentioned above, the photoresist material can also contain one or more free radical-initiated and polymerizable species with molecular weight of at least about 300. Monomers of this type are an alkylene or a polyalkylene glycol diacrylate and those described in U.S. Pat. No. 2,927,022.

Free radical initiators which can be activated by actinic radiation which are thermally inactive at and below 185 degrees C. include the substituted or unsubstituted polynuclear quinones listed in the following: 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrequinone, 1,2-benzanthraquinone, 2,3-benzanthraquinone, 2-methyl-1,4-naphthone, 2,3-dichloronaphthoquinone, 1,4-dimethylanthraquinone, 2,3-dimethylanthraquinone, 2-phenylanthraquinone, 2,3-diphenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione.

Other useful photoinitiators, of which some may be thermally active at temperatures lower than 85 degrees C., are described in U.S. Pat. No. 2,760,863.

Dyes of a photoreducible nature and other reducing agents are described in U.S. Pat. Nos. 2,850,445; 2,875,047; 3,097,096; 3,074,974; 3,097,097; and 3,145,104 as well as dyes of the phenazine, oxazine and quinone clases; Michler's ketone, benzophenone, 2,4,5-triphenylimidazolyl dimers with hydrogen donors, and mixtures thereof as described in U.S. Pat. Nos. 3,427,161; 3,479185 and 3,549,367 can be used as initiators. The cyclohexadienone compounds of U.S. Pat. No. 4,341,860 are also useful as initiators. In addition sensitizers described in U,S. Pat. No. 4,162,162 in combination with photoinitiators and photoinhibitors are useful.

Polymeric binders which can be used alone, or in combination with other of the same or other polymerizable monomers include the following: polyacrylate and alpha-alkyl polyacrylate esters, i.e. polymethyl methacrylate and polyethyl methacrylate; polyvinyl esters: i.e. polyvinyl acetate, polyvinyl acetate/acrylate, polyvinyl acetate/methacrylate and hydrolyzed polyvinyl acetate; ethylene/vinyl acetate copolymers; polystyrene polymers and copolymers, i.e. with maleic anhydride and esters; vinylidene chloride copolymers, i.e. vinylidene chloride/acrylonitrile; vinylidene chloride/methacrylate and vinylidene chloride/vinyl acetate copolymers; polyvinyl chloride and copolymers, i.e. polyvinyl chloride/acetate; saturated and unsaturated polyurethanes; synthetic rubbers, i.e. butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weight from about 4,000 to 1,00,000; epoxides, i.e. containing acrylate or methacrylate groups; copolyesters; nylons or polyamides, i.e. N-methoxymethyl, polyhexamethylene adipamide; cellulose esters, i.e. cellulose acetate succinate and cellulose acetate butyrate; cellulose ethers, i.e. methyl cellulose, ethyl cellulose and benzyl cellulose; polycarbonates; polyvinyl acetal, i.e. polyvinyl butyral, polyvinyl formal; polyformaldehydes.

In addition to the polymeric binders listed above particulate thickeners such as described in U.S. Pat. No. 3,754,920 i.e. silicas, clays, alumina, bentonites, kalonites, and the like can be used.

Where aqueous developing of the photoresist is desirable the binder should contain sufficient acidic or other functionalities to render the composition processable in the aqueous developer. Suitable aqueous-processable binders include those described in U.S. Pat. No. 3,458,311 and in U.S. Pat. No. 4,273,856. Polymers derived from an aminoalkyl acrylate or methacrylate, acidic film-forming comonomer and an alkyl or hydroxyalkyl acrylate such as those described in U.S. Pat. No. 4,293,635 can be included.

Normally a thermal polymerization inhibitor will be present to increase the stability during storage of the photosensitive compositions. Such inhibitors are; p-methoxy-phenol, hydroquinone, alkyl and aryl-substituted hydroqinones and quinones, tert-butyl catechol, pyrogallol, copper resinate, naphthylamines, beta-napthol, cuprous chloride, 2,6-di-tert-butyl-p-cresol, phenothiazine, pyridine, nitrobenzene and dinitrobenzene, p-toluequinone and chloranil. Also useful for thermal polymerization inhibitors are the nitroso compositions described in U.S. Pat. No. 4,168,982.

Dyes and pigments may also be added to increase the visibility of the resist image. Any colorant used however, should be transparent to the actinic radiation used. An example of such phosensitive compositions is described in Table I of U.S. Pat. No. 4,693,959.

In the preparation of these formulations generally inert solvents are employed which are volatile at ordinary pressures. Examples include alcohols and ether alcohols, esters, aromatics, ketones, chlorinated hydrocarbons, aliphatic hydrocarbons, miscellaneous solvents such as dimethylsulfoxide, pyridine, tetrahydrofuran, dioxane, dicyanocyclobutane and 1-methyl-2-oxo-hexamethyleneimine, and mixtures of these solvents in various proportions as may be required to attain solutions. Antiblocking agents to prevent the coatings from adhering to the supporting files can also be included.

With some polymers, it is desirable to add a plasticizer, either solid or liquid, to give flexibility to the film or coating. Suitable plasticizers are described in U.S. Pat. No. 3,658,543. A preferred liquid plasticizer is nolylphenoxypoly(ethyleneoxy)-ethanol. A preferred solid plasticizer is N-ethyl-p-toluenesulfonamide.

Photoimagable compositions are also utilized as solder masks in various industrial processes. In such application a photoimagable composition is used by applying the composition to printed circuit board and followed by photolithographic techniques to expose various underlying features on the board while masking others. During the soldering process the solder will deposit onto the exposed underlying components. It is necessary that the solder mask material be formulated such that it can be applied by the appropriate methods, for example curtain coating. Suitable photoimageable compositions including many that use epoxies are described in the following U.S. Pat. Nos. 4,279,985; 4,458,890; 4,351,708; 4,138,255; 4,069,055; 4,250,053; 4,058,401; 4,659,649; 4,544,623; 4,684,671; 4,624,912; 4,175,963; 4,081,276; 4,693,961; and 4,442,197.

More recently an improved cationically photoimageable solder mask is described in U.S. Pat. No. 5,026,624 assigned to the assignee of the present application, disclosure of which is incorporated herein by reference. In fact U.S. Pat. No. 5,026,624 teaches an improved photoimageable cationically polymerizable epoxy based coating material. The material includes an epoxy resin system consisting essentially of between about 10% to about 80% by weight of a polyol resin which is a condensation product of epichlorohydrin and bisphenol A having a molecular weight of between about 40,00 and 130,000; between about 20% and about 90% by weight of an epoxidized octafunctional bisphenol A formaldehyde novolak resin having a molecular weight of 4,00 to 10,000; and between about 35% and 50% by weight of an epoxidized glycidyl ether of tetrabromo bisphenol A having a molecular weight of between about 600 and 2,5000 if flame resistant properties are desired. To this resin system is added about 0.1 to about 15 parts by weight per 100 parts of resin of a cationic photoinitiator capable of initiating polymerization of said epoxidized resin system upon expose to actinic radiation; optionally a photosensitizer in an amount of up to about 10 parts by weight may be added.

The solder mask material is normally exposed to UV radiation from a medium pressure mercury lamp through a phototool which is opaque in the areas where the solder mask is to be removed. After exposure to UV radiation, the circuit boards are baked for a short time to accelerate the crosslinking reaction initiated by the sulfonium salt photolysis products. Bake temperatures between about 100 degrees C. and 150 degrees C. and times between about 2 and 10 minutes are used. An example of such formulation is given in U.S. Pat. No. 5,026,624 Table I.

In processing negative working resists, unexposed areas of the imaged film are typically removed from the surface of a printed circuit board or substrate by action of a liquid developer in a spray form for a duration of several minutes or less. Depending on the particular type of photoresist composition the liquid developer may be a simple organic solvent, an aqueous solution of an inorganic base, or as described in U.S. Pat. No. 3,475,171, a combination of organic solvent and aqueous base to form a semi-aqueous developer.

Methyl chloroform (MCF), a/k/a 1,1,1-trichloroethane, and methylene chloride (MC), a/k/a dichloromethane are solvents which are widely used in the electronic packaging art and in other arts for developing and removing a number of photoresists which are otherwise resistant to chemical attack. Highly alkaline electroless copper plating bath used in additive processes, for example, typically provides a harsh environment for photoresist. In general, the more chemically impervious resists are removable in an organic solvent such as methylene chloride. For less demanding chemical environments, aqueous developable photoresists may be adequate. The organically developable resists, however, continue to be used in an electroless copper environment and in the print band and thin film technologies in conjunction with acrylate-based resist such as DuPont's Riston T-168 and solvent processed solder masks such as the DuPont Vacrel 700 and 900 series, environments in which the aqueous resists are vulnerable.

Use of 1,1,1-trichloroethane and methylene chloride is disfavored because of growing environmental concerns over the effect of gaseous halogenated hydrocarbons on the depletion of earth's ozone layer and concerns over introducing suspected carcinogens to the atmosphere. Several countries have set goals for their total elimination. However, there continue to be many manufacturing processes in which use of resists which are aqueously developable simply is not feasible.

The industry therefore continues the search for organic solvents as alternates to 1,1,1-trichloroethane and methylene chloride. The new solvents must meet specific manufacturing and environmental requirements with respect to flammability, toxicity, ability to effect dissolution, shelf-life, waste disposal, ability to recycle, simplicity of composition, and compatibility with a spectrum of resists.

Alternative solvents for stripping solvent based Riston photoresists are also described in *Research Disclosures* June 1989 p.302, published anonymously. There have been previous attempts reported in the art to provide environmentally friendly alternatives to 1,1,1-trichloroethane and methylene chloride. However, none of the references describe the simple, environmentally acceptable, room temperature developer and stripper of the present invention.

SUMMARY

Accordingly, it is an object of the invention to provide an environmentally friendly, non-hazardous developer which is effective to remove organic solvent-developable photoresist from preselected regions.

It is a further object of the invention to provide a developer which is comprised of substantially one simple compound, which is effective to remove photoresist from preselected regions in a reasonably short time at or about room temperature.

Still another object of the invention is to provide an alternative to halogenated hydrocarbon developer for use in developing acrylate based photoresist such as Riston T-168 and polymethyl methacrylate, and solvent processed solder masks such as the DuPont Vacrel 900 series, free radical initiated, additive polymerizable, acrylate monomer, dry film solder masks. The proposed alternative includes developing the radiation-exposed resist in a high boiling solvent selected from the group consisting of propylene carbonate (PC), gamma butyrolactone (BLO) and benzyl alcohol (BA). The process occurs at about 15 to 45 degrees C. for about 0.5–12 minutes and is normally followed by a warm water or alternate low boiling solvents rinse to remove excess developer.

Alternatively, the developer may include also, in amounts of about 0.1 up to about 10% by weight of additive selected from the group consisting of methanol, ethanol, isopropyl alcohol, propylene glycol monomethyl acetate, ethylene glycol monomethyl ether, formamide, nitromethane, propylene oxide, methyl ethyl ketone, acetone and water.

Still another object of the invention is to provide an alternative to halogenated hydrocarbon stripper for use in stripping acrylate based photoresist such as Riston T-168 and Vacrel 700 and 900 series or any solvent processable solder mask and a method for stripping a polymethyl methacrylate resist which comprises stripping the radiation-exposed resist in a high boiling solvent such as propylene carbonate, gamma butyrolactone and benzyl alcohol. When the aforementioned solvents are employed, the process occurs at about to about 100 degrees C. for about 6 to about 12 minutes and is normally followed by a warm water rinse to remove excess stripper.

Alternatively, the stripper may include also, in amounts of about 0.1 up to about 10% by weight, additive selected from the group consisting of methanol, ethanol, isopropyl alcohol, propylene glycol monomethyl acetate, ethylene glycol monomethyl ether, formamide, nitromethane, propylene oxide, methyl ethyl ketone, acetone and water.

The present invention utilizes solvents of non-toxic nature for stripping Riston type photoresists effectively. The use of low boiling solvents such as methyl chloroform (MCF), methyl ethyl ketone (MEK), xylenes or mixtures of the above are similar to the methylene chloride stripping process. On the other hand the use of high boilers, i.e. n-methyl pyrolidone (NMP), gamma-butyrolactone (BLO), dimethyl sulfoxide (DMSO) and propylene carbonate (PC) are followed by a rinsing step with compatible solvent or water. As an extension it is more effective in order to obtain dissolution times comparable to those of MC if the temperature during stripping is maintained at above about 50 degrees C. with a fluctuation of +/−3 degrees C. It has been found that improved dissolution times can be achieved with stripping temperatures between 50 degrees C. and 100 degrees C. and conditions which are incorporated in the present invention.

In all development and stripping operations described above, the removal of the photoresist or solder mask can be assisted by a squeegee roll action after the development step and gentle scrubbing action using brushes during the stripping step in order to minimize dragout and reduce residue. Also, water rinse after stripping can be replaced by rinsing in low boiling solvents such as isopropyl alcohol, acetone, methyl ethyl ketone and xylenes.

BRIEF DESCRIPTION OF THE PREFERRED EMBODIMENTS

In order to facilitate understanding of the present invention, reference is made to the following non-limiting detailed examples.

EXAMPLE 1

Signal cores having dimensions 24 inch by 28 inch were obtained after circuit line exposure in Riston T-168 but prior to any developing process, and placed in the developer while agitating. Experimental conditions are given in Table I. After the line channels were clean, samples were rinsed with hot water. The developed panels were subjected to additive copper plating. Line widths and line flaring were measured by crosssectioning part of the panel. Results obtained from the above experimental conditions (Table II) indicate no significant deviation from the normal process of using methyl chloroform as the developer. The MCF was obtained as MCF-348PPG, from Pittsburgh Plate Glass. It is believed that this form of MCF includes inhibitor, such as acid buffer. The propylene carbonate develop process was found to be less-sensitive to temperature than were the other developers. These solvents can be used in both dip and spray process conditions. In the case of propylene carbonate using improved processing conditions both for the develop and water rinse step (Table III) the results obtained are comparable to those obtained employing methyl chloroform as the developer (Table IV).

It should be noted that the development and rinse steps in all Tables have been given upper working limits only because it would be inefficient to extend the times. Therefore, times beyond those noted are deemed to be equivalents of those in the Tables.

TABLE I

| | Development | | | Water Rinsing | |
|---|---|---|---|---|---|
| Solvent | BP (°C.) | Temp (°C.) | Time (Mins.) | Temp (°C.) | Time (Mins.) |
| PC | 240 | 23-40 | 6-12 | 46-55 | 5-10 |
| BLO | 205 | 16-23 | 5-9 | 46-55 | 5-10 |
| BA | 205 | 16-25 | 6-10 | 46-55 | 5-10 |

TABLE II

| | MCF-348PPG | PC | BLO |
|---|---|---|---|
| Average Line width (mil) | 3.252 | 3.441 | 3.517 |
| Line Angle (degrees) | 84.7 | 83.8 | 78.0 |
| X-Area (% of rectangle) | 95.5 | 95.7 | 91.9 |
| Adhesion Strength (gm/mil) | 17 | 14 | 21 |

TABLE III

| | |
|---|---|
| PC pressure (psi) | 10-60 (15-35) |
| PC temperature (°C.) | 15-45 (25-35) |
| Exposure time (minutes) | 0.5-12 (3-7) |
| Water rinse pressure (psi) | 6-60 (15-35) |
| Water temperature | 17-60 (25-45) |
| Exposure time (mins) | 5-15 (5-10) |

The values in parentheses denote the preferred ranges.

TABLE IV

| | PC | MCF-348PPG |
|---|---|---|
| 1. Line width top | | |
| (mean) | 3.05 | 3.06 |
| (std dev) | 0.21 | 0.30 |
| Bottom width | | |
| (mean) | 3.34 | 3.35 |
| (std. dev) | 0.45 | 0.36 |
| 2. X-sectional area line (sq. in) | 95.7 | 95.5 |
| 3. Line Angle (degrees) | 85.1 = 2.0 | 84.9 = 1.8 |
| 4. Adhesion Strength (gm/mil) | 17.6 | 17 |

EXAMPLE 2

Coupons were made from composites coated with DuPont Vacrel 930, free radical initiated, additive polymerizable, acrylate monomer, dry film solder mask material were obtained and placed in gamma-butyrolactone while stirring. Development time was observed to be about 2 minutes at about 22 degrees C. Coupons were processed through hot water rinse to remove any solvent residue. All coupons were processed through the following steps after solvent developing. A) Post Develop Vacuum Bake: 150 degrees C., 2 hrs. B) UV Bump: 6 Joules. C) Vapor Blast: Conveyor speed, 2.0 6 ft/minute; Spring pressure: 35 psi, Blast medium, Aluminum oxide. After above steps (A,B,C), all coupons were processed through the normal post-Vacrel clean cycle and tin immersion solder line.

EXAMPLE 3

Coupons from example 2 wherein Vacrel 930 had been exposed to actinic radiation were placed in gamma-butyrolactone and agitated at 60 degrees C. The exposed Vacrel was stripped off the surface of the laminate within 2.5 minutes.

EXAMPLE 4

Coupons were made from composites coated with DuPont Vacrel 930, free radical initiated, additive polymerizable, acrylate monomer, dry film solder mask material were obtained and placed in propylene carbonate while stirring. Development time was observed to be 10 minutes at 22 degrees C. Hot water rinse after development removed the excess solvent on the coupons. Another set of coupons from above having exposed Vacrel on the surface were processed through propylene carbonate and the exposed Vacrel 930 was stripped off the laminates within about 6 to about 7 minutes at solvent temperature of about 60 degrees C.

EXAMPLE 5

Circuit laminates 10×15 inch were coated with an improved cationically photoimageable solder mask which is disclosed in U.S. Pat. No. 5,026,624 assigned to the assignee of the present application, disclosure of which is incorporated herein by reference. An example of such formulation is given in Table I of the above referenced patent.

These laminates were exposed to UV radiation of about 1200-1500 mjoules from a medium pressure mercury lamp through a phototool which is opaque in the areas where the solder mask is to be removed. After exposure to UV radiation, the laminates were baked at 125 degrees C. for about 20 to 30 minutes to facilitate the crosslinking reaction initiated by the sulfonium salt photolysis products. Coupons (1 cm square) were then taken from the above samples and developed in propylene carbonate by dipping with agitation action and heated to about 30 to 40 degrees C. for about 1-3 minutes to produce the desired pattern on the surface of the circuit board. The developer spray pressure was set at 25-50 psi and the water rinse was 25 to 36 psi at room temperature.

Another set of coupons of the same dimensions (1 sq cm) and having exposed solder mask (crosslinked) was treated with propylene carbonate at 99 to 116 degrees C. It was observed that the solder mask in this case was stripped off the laminate surface within about 8-12 minutes.

EXAMPLE 6

Signal cores having dimmensions 24 inch by 28 inch were obtained after circuit line exposure in Riston T-168 and developed using propylene carbonate. Coupons from these panels having exposed Riston T168 were then tested in stripping experiments. The stripping ability and dissolution times were measured for the various solvents at a range of temperatures listed in Table VI. Improved experimental conditions for propylene carbonate and gamma butyrolactone in stripping T168 are shown in Table VII. It was also observed that use of scrubbing brushes lowered the solvent residence time and reduced the residual resist level on the circuit boards.

TABLE VI

Dissolution time of crosslinked T168 for high boiling solvents. Dissolution time is in minutes.

| TEMP (°C.) | PC | BLO | MCF-348PPG | BA | MC |
| --- | --- | --- | --- | --- | --- |
| 24 | 190 | 190 | 190 | 190 | 1.5 |
| 40 | 75 | 22 | 45 | — | — |
| 50 | 25 | 6 | 15 | — | — |
| 60 | 8 | 3 | 6 | 4 | — |
| 80 | 1.4 | 0.22 | 0.85 | | |
| 100 | 0.23 | 0.02 | 0.12 | | — |

TABLE VII

| Solvent | Temp (°C.) | Time (min) | Pressure (psi) |
| --- | --- | --- | --- |
| MC | 26-32 | 10-15 | 15-40 |
| PC | 50-100 | 5-30 | 15-90 |
| | (64-86) | (8-15) | (50-75) |
| BLO | 50-100 | 5-30 | 15-90 |
| | (50-60) | (8-15) | (50-75) |

The values shown in parentheses are the preferred conditions. Water rinse conditions in combination with the conditions in Table VII for the propylene carbonate and gamma butyrolactone were the following: rinse temperature: between about 20-60 degrees C., with the most preferred being about 30-40 degrees C., rinse pressure: between about 15-60 psi, with the preferred being about 25-35 psi, and rinse time: between about 5-20 minutes with the most preferred being about 8-15 minutes.

EXAMPLE 7

Riston T-168 film 2.2 mil thick was laminated onto 1 oz copper foil and exposed to UV radiation at 65 mj/sq cm. Samples ¾ in. by ½ in. were cut and placed in propylene carbonate at 60 degrees C. Debonding time was determined by using a photonic sensor apparatus and was measured to be about 503 seconds +/−16 seconds. Similarly samples having the same dimensions were placed in propylene carbonate containing 7-8% water and thermally equilibrated to 60 degrees C. The debonding time was reduced to about 300+/−8 seconds.

EXAMPLE 8

Vacrel 930 was laminated onto 1 oz copper foil and exposed to UV radiation as described in example 2. Samples ¾ in. by ½ in. were cut and placed in propylene carbonate at 60 degrees C. Debonding time was determined by using a photonic sensor apparatus and was measured to be about 630 seconds +/−20 seconds. Similarly samples having the same dimensions were placed in propylene carbonate containing 7-8% water and thermally equilibrated to 60 degrees C. The debonding time was reduced to about 354+/−10 seconds.

It is understood that the invention may be embodied in modifications of the present invention forms without departing from the spirit or central characteristics thereof. The aforementioned examples and embodiments are therefore to be considered in all respects as illustrative rather than restrictive, and the invention is not to be limited to the details given herein.

What is claimed is:

1. A method of patterning a free-radical initiated, addition polymerizable acrylate monomer photoresist, comprising the steps of:
   a. providing the acrylate monomer photoresist film on a substrate;
   b. selectively exposing at least one predetermined area of the acrylate photoresist film to actinic radiation for a time sufficient to effect a contrast in the extent of crosslinking in the exposed and unexposed areas of the photoresist film; and
   c. developing the exposed acrylate photoresist film in a developing solvent consisting essentially of propylene carbonate and from about 0.1 to about 10 weight percent of an additive selected from the group consisting of methanol, ethanol, isopropyl alcohol, propylene glycol monomethyl acetate, formamide, nitromethane, propylene oxide, methyl ethyl ketone, and water at a temperature of about 15 degrees Centigrade to about 45 degrees Centigrade for about 0.5 to about 12 minutes.

2. A method of patterning a free-radical initiated, addition polymerizable acrylate monomer photoresist, comprising the steps of:
   a. providing the acrylate monomer photoresist film on a substrate;
   b. selectively exposing at least one predetermined area of the acrylate photoresist film to actinic radiation for a time sufficient to effect a contrast in the extent of crosslinking in the exposed and unexposed areas of the photoresist film;
   c. developing the exposed acrylate photoresist film in a developing solvent consisting essentially of propylene carbonate and from about 0.1 to about 10 weight percent of an additive selected from the group consisting of methanol, ethanol, isopropyl alcohol, propylene glycol monomethyl acetate, formamide, nitromethane, propylene oxide, methyl ethyl ketone, and water; and d. thereafter rinsing the photoresist coated substrate with water at a temperature of about 17 degrees Centigrade to about 60 degrees Centigrade.

3. A method of patterning a free-radical initiated, addition polymerizable acrylate monomer photoresist, comprising the steps of:

a. providing the acrylate monomer photoresist film on a substrate;

b. selectively exposing at least one predetermined area of the acrylate photoresist film to actinic radiation for a time sufficient to effect a contrast in the extent of crosslinking in the exposed and unexposed areas of the photoresist film;

c. developing the exposed acrylate photoresist film in a developing solvent consisting essentially of propylene carbonate and from about 0.1 to about 10 weight percent of an additive selected from the group consisting of methanol, ethanol, isopropyl alcohol, propylene glycol monomethyl acetate, formamide, nitromethane, propylene oxide, methyl ethyl ketone, and water at a temperature of about 15 degrees Centigrade to about 45 degrees Centigrade for about 0.5 to about 12 minutes; and d. thereafter rinsing the photoresist coated substrate with water at a temperature of about 17 degrees Centigrade to about 60 degrees Centigrade.

* * * * *